US008861263B2

(12) United States Patent
Lee

(10) Patent No.: US 8,861,263 B2
(45) Date of Patent: Oct. 14, 2014

(54) SEMICONDUCTOR MEMORY DEVICE

(71) Applicant: SK Hynix Inc., Icheon (KR)

(72) Inventor: Seung Hyun Lee, Seoul (KR)

(73) Assignee: SK Hynix Inc., Icheon (KR)

( * ) Notice: Subject to any disclaimer, the term of this patent is extended or adjusted under 35 U.S.C. 154(b) by 39 days.

(21) Appl. No.: 13/717,570

(22) Filed: Dec. 17, 2012

(65) Prior Publication Data
US 2013/0314979 A1 Nov. 28, 2013

(30) Foreign Application Priority Data
May 25, 2012 (KR) ........................ 10-2012-0056361

(51) Int. Cl.
G11C 11/00 (2006.01)
G11C 11/16 (2006.01)
G11C 7/06 (2006.01)
G11C 7/12 (2006.01)
G11C 7/14 (2006.01)

(52) U.S. Cl.
CPC ............ *G11C 11/16* (2013.01); *G11C 11/1673* (2013.01); *G11C 7/062* (2013.01); *G11C 7/12* (2013.01); *G11C 7/14* (2013.01)
USPC ........... 365/158; 365/148; 365/171; 365/173; 365/189.011; 365/207

(58) Field of Classification Search
CPC .. G11C 11/16; G11C 13/004; G11C 11/1673; G11C 13/0002; G11C 7/18
USPC .......... 365/158, 148, 171, 173, 189.011, 205, 365/207
See application file for complete search history.

(56) References Cited

U.S. PATENT DOCUMENTS 7,286,429 B1 10/2007 Liaw et al.
7,755,923 B2 * 7/2010 Liu et al. ........................ 365/148
2011/0194330 A1 8/2011 Liu et al.

* cited by examiner

*Primary Examiner* — Thong Q Le

(57) ABSTRACT

A semiconductor memory device includes a memory cell unit including a plurality of memory cells coupled between a plurality of word lines and a plurality of bit lines, and configured to provide a read value in response to an activated word line, a reference value generating unit including a plurality of reference value generating cells coupled between the plurality of word lines and a reference bit line, and configured to provide a single reference value in response to the activated word line, and a sense circuit configured to provide a sense output signal based on the single reference value and the read value.

17 Claims, 7 Drawing Sheets

PARALLEL MAGNETIZATION
LOW RESISTANCE PHASE

ANTI-PARALLEL MAGNETIZATION
HIGH RESISTANCE PHASE

SEMICONDUCTOR MEMORY DEVICE

CROSS-REFERENCE TO RELATED APPLICATION

The priority of Korean patent application No. 10-2012-0056361 filed on May 25, 2012 the disclosure of which is hereby incorporated in its entirety by reference, is claimed.

BACKGROUND OF THE INVENTION

The present invention relates to a semiconductor memory device, and more specifically, to a semiconductor memory device including a reference value generating cell.

Memory manufacturers have steadily developed next generation memories in order to overcome limitations of a flash memory device, which is a type of nonvolatile memory device. These next generation memories include a ferroelectric random access memory (FeRAM), a magnetic RAM (MRAM), a phase change RAM (PCRAM), a nano floating gate memory (NFGM), a resistive RAM (ReRAM), and a spin transfer torque magnetic RAM (STTRAM).

An STTRAM is a memory for controlling a current flow with a magnetic junction tunnel using a spinning property of electrons. Although a high degree of precision is required to form thin films, the STTRAM has a simple structure with an ultra-high degree of integration of below 30 nm and low power consumption.

BRIEF SUMMARY OF THE INVENTION

Embodiments of the present invention are directed to providing a semiconductor memory device that can complement a variation of a reference value that is used to determine a bit value of data written in a memory cell. The variation of the reference value may be caused, for example, by a manufacturing process variation.

Embodiments of the present invention are also directed to providing a semiconductor memory device that includes a reference value generating cell having a different size from that of a memory cell where data is written, and is configured to compare an output signal of the reference value generating cell with an output signal of the memory cell so as to determine a bit value of data written in the memory cell.

Moreover, embodiments of the present invention are directed to improving space efficiency by including a single reference value generating cell and controlling a write current supplied to the reference value generating cell in order to control a variation of a reference value caused by a size deviation of the reference value generating cell, which may be caused by a manufacturing process variation.

According to an embodiment of the present invention, a semiconductor memory device comprises: a memory cell unit including a plurality of memory cells coupled between a plurality of word lines and a plurality of bit lines, and configured to provide a read value in response to an activated word line; a reference value generating unit including a plurality of reference value generating cells coupled between the plurality of word lines and a reference bit line, and configured to provide a single reference value in response to the activated word line; and a sense circuit configured to provide a sense output signal based on the single reference value and the read value.

Each of the memory cells and the reference value generating cells includes one transistor and one magnetic tunnel junction (MTJ), and an MTJ included in a reference value generating cell is larger than an MTJ included in a memory cell.

The semiconductor memory device further comprises a data determining unit configured to receive the sense output signal and determine the read value as first data if the read value is the same as or greater than the single reference value and as second data if the read value is smaller than the single reference value.

The reference value generating cell unit comprises a write/read unit configured to control the reference value generating cells using the reference bit line so that the reference value generating cells have a predetermined resistance value.

According to another embodiment of the present invention, a semiconductor memory device comprises: a reference value generating cell unit including a plurality of reference value generating cells coupled between at least one first word line and a plurality of reference generating bit lines, and configured to provide a single reference value in response to an activated first word line; a memory cell unit including a plurality of memory cells coupled between a plurality of second word lines and a plurality of bit lines, and configured to provide a read value in response to an activated second word line; and a sense circuit configured to provide a sense output signal based on the single reference value and the read value.

The semiconductor memory device further comprises a reference value control unit configured to generate a reference control signal for controlling a reference generating signal supplied to the plurality of reference generating bit lines or source lines coupled to the plurality of reference value generating cells so as to determine the single reference value.

Each of the memory cells includes one MTJ and one transistor that are coupled in series between a corresponding bit line and a corresponding source line, and the transistor performs a switching operation in response to activation of a corresponding second word line.

Each of the reference value generating cells includes one MTJ and one transistor that are coupled in series between a corresponding reference generating bit line and a corresponding source line, and the transistor performs a switching operation in response to activation of the first word line.

The MTJ included in the reference value generating cells is larger than the MTJ included in the memory cell.

The single reference value is generated based on an average resistance value of reference value generating cells coupled to the activated first word line.

The average resistance value is obtained by a part or all of the reference value generating cells included in the reference value generating cell unit.

According to still another embodiment of the present invention, a semiconductor memory device comprises: memory cell blocks each of which includes reference value generating cells coupled between at least one first word line and a plurality of bit lines and memory cells coupled between the bit lines and a plurality of second word lines in parallel with the first word line; a word line control unit configured to control each word line of the memory cell blocks; and a bit line control unit configured to control each of bit line of the memory cell blocks. In a read operation, the word line control unit is configured to activate a first word line of a first one of the memory cell blocks so as to output a single reference value based on an average resistance value of reference value generating cells in the first memory cell block, and to activate one of second word lines of a second one of the memory cell blocks based on an address signal so as to output a read value from a memory cell in the second memory cell block which is selected by the address signal.

Each of the reference value generating cells and the memory cells, includes one transistor and one MTJ that are coupled in series between a corresponding bit line and a corresponding source line, and an MTJ included in a reference value generating cell is larger than an MTJ included in the memory cell.

The bit line control unit is configured to control a read current supplied to bit lines or source lines coupled to the first memory cell block so as to determine the single reference value.

The semiconductor memory device further comprises a data determining unit configured to compare the read value with the single reference value so as to determine a logic value, i.e., a bit value, of the data written in the selected memory cell.

The average resistance value is obtained by a part or all of the reference value generating cells included in the first memory cell block.

The first and second word lines of the first memory cell block are separately controlled from those of the second memory cell block.

DESCRIPTION OF EMBODIMENTS

Exemplary embodiments of the present invention will be described in detail with reference to the attached drawings. Wherever possible, the same reference numbers will be used throughout the drawings to refer to the same or like parts, and the same or like parts will not be repeatedly explained.

However, embodiments will be described herein with reference to the drawings, which are schematic or functional illustrations of exemplary embodiments, for illustrative purposes only. As such, variations from the shapes of the illustrations as a result, for example, of manufacturing techniques and/or tolerances, are to be expected. Thus, exemplary embodiments of the present invention should not be construed as being limited to the particular shapes of regions illustrated herein, but may include deviations in shapes that result, for example, from manufacturing.

FIGS. 1a to 1d illustrate memory cell structures of an STTRAM according to embodiments of the present invention.

Figure 1A:
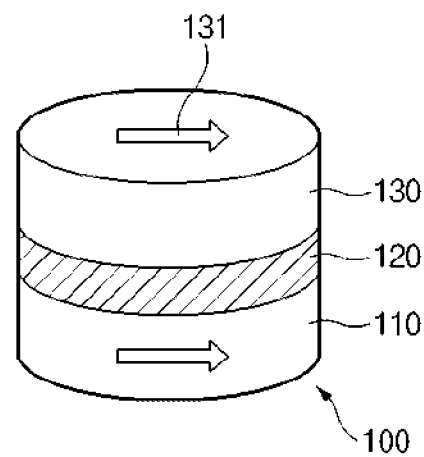
FIGS. 1a to 1d illustrate memory cell structures of an STTRAM according to embodiments of the present invention.
Figure 1B:
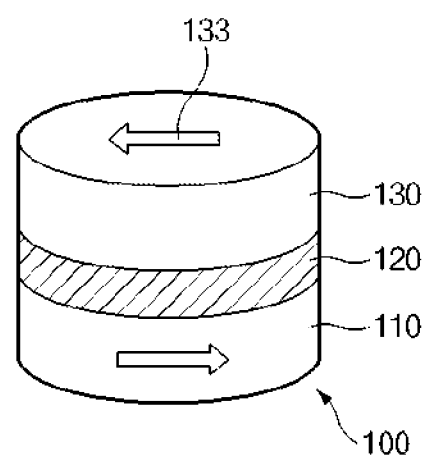

FIGS. 1a and 1b are cross-sectional views of a magnetic tunnel junction (MTJ) 100 included in the STTRAM.

Referring to FIGS. 1a and 1b, the MTJ 100 includes a fixed layer 110, a tunnel barrier layer 120, and a free layer 130. While a magnetization direction of the fixed layer 110 keeps consistent, a magnetization direction of the free layer 130 changes so that a resistance value of the MTJ 100 is changed.

Referring to FIG. 1a, if a magnetization direction 131 of the free layer 130 is the same as the magnetization direction of the fixed layer 110, the MTJ 100 has a low resistance state. Referring to FIG. 1b, if a magnetization direction 133 of the free layer 130 is opposite to the magnetization direction of the fixed layer 110, the MTJ 100 has a high resistance state. The low resistance state and the high resistance state may correspond to logic values 'high' and 'low,' respectively, or data '0' and '1,' respectively.

Figure 1C:
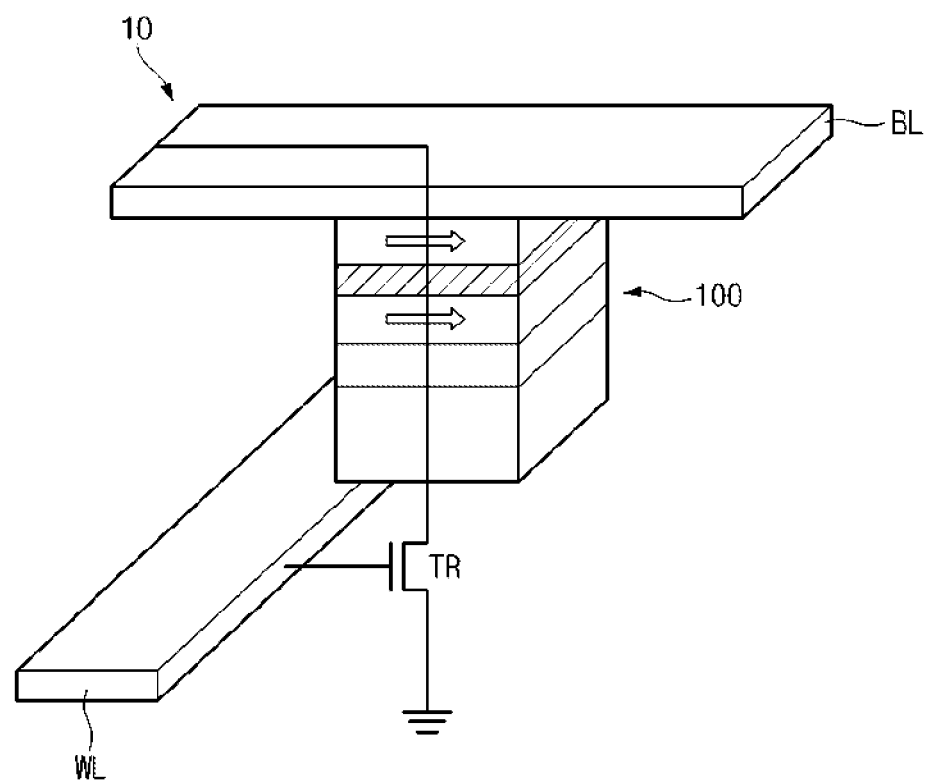

FIG. 1c illustrates write and read operations of an STTRAM memory cell.

The STTRAM uses electrons that are spin-polarized when the electrons pass through a thin film that acts as a spin filter. The spin-polarized electrons apply a torque on a free layer, which changes polarity of the free layer to write data. The read operation is performed to detect a resistance value or a logic value of data written in a memory cell. The read operation of the STTRAM is similar to that of a conventional MRAM.

Referring to FIG. 1c, an STTRAM memory cell structure 10 includes an MTJ 100, a transistor TR, a bit line BL, and a word line WL.

In write and read operations, the transistor TR is turned on to supply a current to the MTJ 100. A logic value of the MTJ 100 is electrically determined, which is different from a magnetic write operation in the conventional MRAM.

Figure 1D:
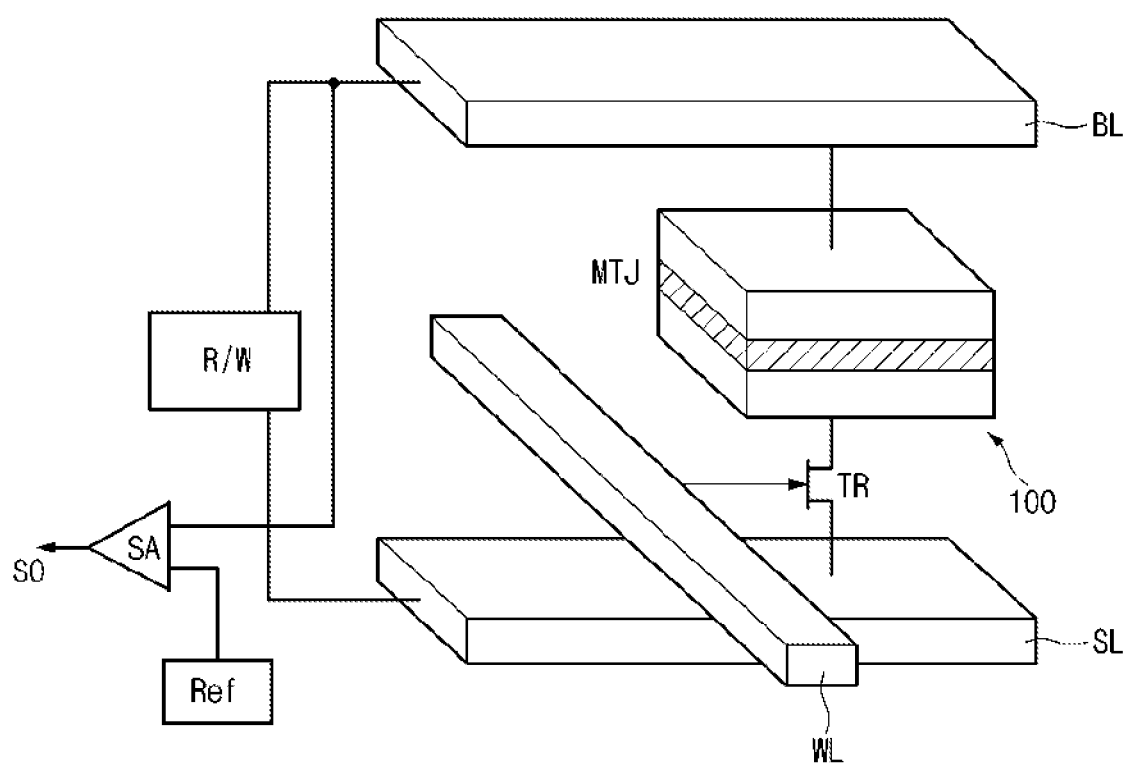

FIG. 1d illustrates an STTRAM memory cell structure and peripheral circuits.

The STTRAM includes a sense amplifier SA, a read/write circuit R/W, and a reference value generator Ref as well as the STTRAM memory cell structure including the MTJ 100, the transistor TR, the bit line BL, and the word line WL shown in FIG. 1c. A write operation of the STTRAM is electrically performed. The read/write circuit R/W generates a write voltage and is disposed between the bit line BL and a source line SL. Depending on the polarity of a voltage between the bit line BL and the source line SL, the polarity of a free layer of the MTJ 100 may change, so that a logic value of the MTJ 100 can be determined. In a similar way, a read current is generated during the read operation, and the read current flows between the bit line BL and the source line SL through the MTJ 100. When the read current is allowed to flow through the transistor TR, a resistance value, i.e., the logic value, of the MTJ 100 may be determined based on a voltage difference between the bit line BL and the source line SL. The voltage difference is compared with a reference value Ref, and amplified by the sense amplifier SA. As a result, the sense amplifier SA outputs a sense output signal SO.

As mentioned above, data written in a memory cell of the STTRAM according to an embodiment of the present invention can be determined by comparing a read value, which corresponds to a resistance value or a logic value of the MTJ 100, with the reference value Ref, the read value depending on the voltage difference between the bit line BL and the source line SL.

Figure 2A:
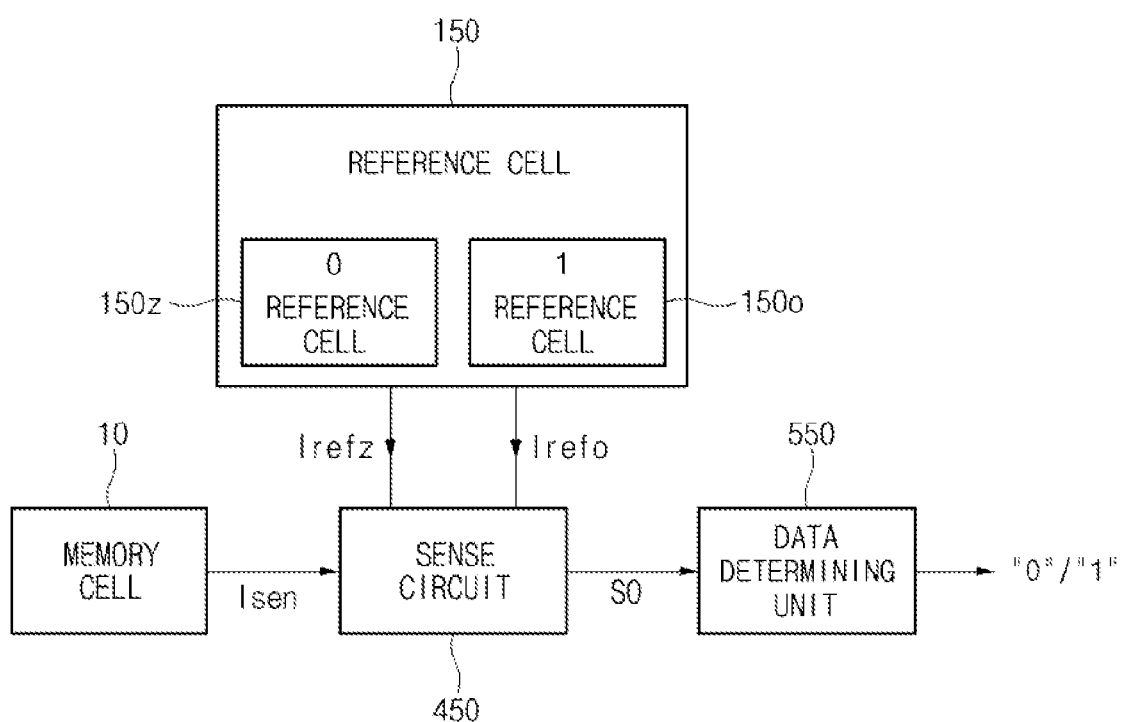
FIG. 2a illustrates a method of determining a logic value of data written in a memory cell of a conventional semiconductor memory device.

FIG. 2a illustrates a view for describing a method of determining a logic value of data written in a memory cell of a conventional semiconductor memory device.

Referring to FIG. 2a, in order to determine a logic value of data written in a memory cell 10, a sense circuit 450 receives a sense current Isen from the memory cell 10, and a '0' reference current Irefz and a '1' reference current Irefo from a reference cell unit 150.

The reference cell unit 150 includes a '0' reference cell 150z and a '1' reference cell 150o. For example, although the '0' reference cell 150z and the '1' reference cell 150o may respectively include an MTJ that is substantially the same as that of the memory cell 10, a free layer in the MTJ of the '0' reference cell 150z and that of the '1' reference cell 150o may have different polarity from each other, so that the '0' reference current Irefz and the '1' reference current Irefo have different values from each other. These reference currents Irefz and Irefo define regions. By determining which region the sense current Isen corresponds to, the logic value of the data written in the memory cell 10 can be determined.

For example, the sense circuit 450 may perform a two-step amplification operation. That is, the sense circuit 450 may first amplify a difference between the sense current Isen and the '0' reference current Irefz and a difference between the sense current Isen and the '1' reference current Irefo, and then re-amplify each amplified signal so as to output the re-amplified signal as a sense output signal SO. In accordance with another example, the sense circuit 450 may average the '0' reference current Irefz and the '1' reference current Irefo to compare the average current value with the sense current Isen, and amplify a difference between the average current value and the sense current Isen to output the sense output signal SO.

A data determining unit 550 determines whether the data written in the memory cell 10 is "0" or "1" based on the sense output signal SO.

As stated above, in order to determine the logic value, i.e., a bit value, of the data written in the memory cell 10, '0' and '1' reference values are needed and thus, it is preferable to have considerable space for the reference cell unit 150 to generate the two reference values.

Figure 2B:
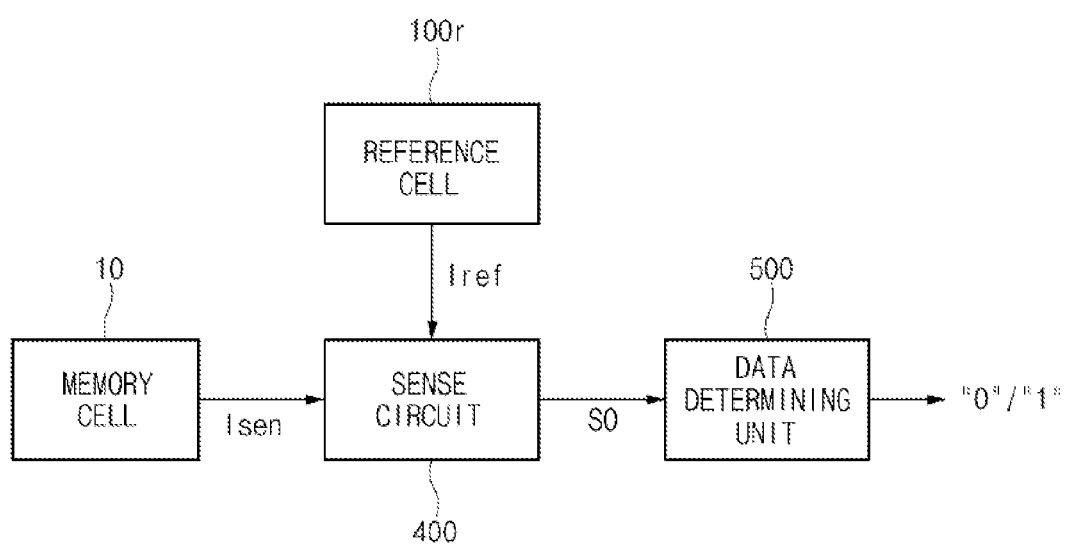
FIG. 2b illustrates a method of determining a logic value of data written in a memory cell of a semiconductor memory device according to an embodiment of the present invention.

FIG. 2b illustrates a method of determining a logic value of data written in a memory cell of a semiconductor memory device according to an embodiment of the present invention.

Referring to FIG. 2b, a sense circuit 400 receives a sense current Isen from a memory cell 10 and a reference current Iref from a reference cell 100r, amplifies a difference between the sense current Isen and the reference current Iref, and outputs the amplified signal as a sense output signal SO.

The reference cell 100r may include an MTJ having a different size from that of the memory cell 10. Accordingly, a voltage value required to change the polarity of a free layer of the MTJ of the reference cell 100r may be different from that of the memory cell 10. If the polarity of the free layer of the reference cell 100r is different from that of the memory cell 10, a current value flowing in the reference cell 100r may also be different from that of the memory cell 10.

For example, if the MTJ of the reference cell 100r is larger than that of the memory cell 10, when a given voltage is applied to the reference cell 100r, the reference current Iref output from the reference cell 100r may have an intermediate value for determining a logic value of data written in the memory cell 10. In other words, if the MTJ of the reference cell 100r is larger than that of the memory cell 10, data "0" corresponds to a sense current Isen from the memory cell 10 that is larger than the reference current Iref, and data "1" corresponds to a sense current Isen that is smaller than the reference current Iref. In accordance with an embodiment of the present invention, the size of the MTJ of the reference cell 100r may be 1.4 times larger than that of the MTJ of the memory cell 10.

A data determining unit 500 determines whether the data written in the memory cell 10 corresponds to a logic value "0" or "1" based on the sense output signal SO. Thus, in a semiconductor memory device according to an embodiment of the present invention, it is possible to minimize the space required for a reference cell unit using a single reference cell including an MTJ that has a different size from that of the memory cell 10.

Figure 3:
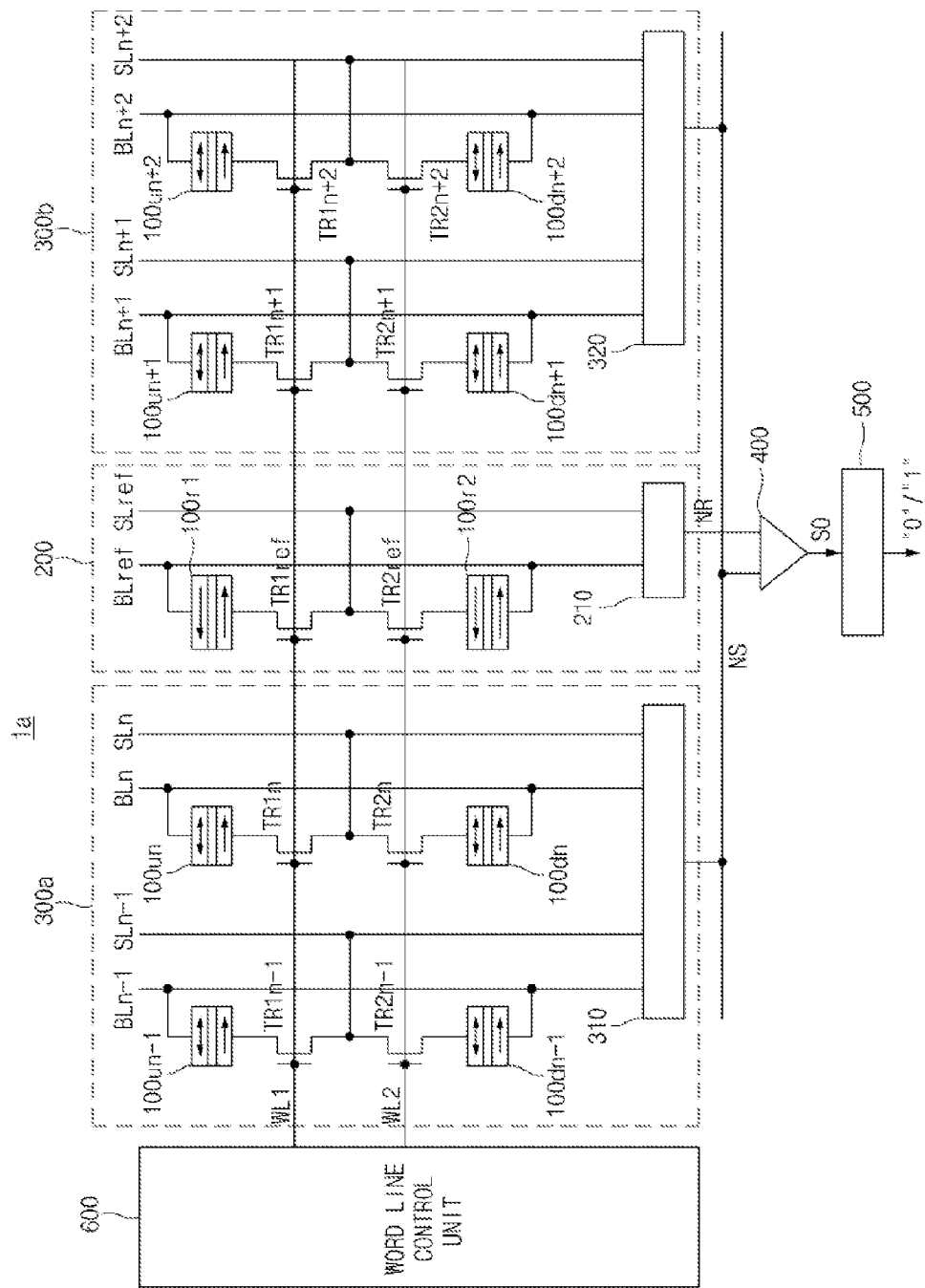
FIG. 3 illustrates a semiconductor memory device according to an embodiment of the present invention.

FIG. 3 illustrates a semiconductor memory device 1a according to an embodiment of the present invention.

Referring to FIG. 3, the semiconductor memory device 1a includes memory cell units 300a and 300b, a reference value generating cell unit 200, and a sense circuit 400.

The semiconductor memory device 1a may further include a word line control unit 600 and a data determining unit 500.

The memory cell unit 300a includes transistors TR1$n$−1, TR2$n$−1, TR1$n$, and TR2$n$ coupled between word lines WL1 and WL2 and bit lines BL$n$−1 and BL$n$, and MTJs 100$un$−1, 100$dn$−1, 100$un$, and 100$dn$. The memory cell unit 300b includes transistors TR1$n$+1, TR2$n$+1, TR1$n$+2, and TR2$n$+2 coupled between the word lines WL1 and WL2 and bit lines BL$n$+1 and BL$n$+2, and MTJs 100$un$+1, 100$dn$+1, 100$un$+2, and 100$dn$+2.

Each memory cell may include a corresponding one of the MTJs 100$un$−1, 100$dn$−1, 100$un$, 100$dn$, 100$un$+1, 100$dn$+1, 100$un$+2, and 100$dn$+2 and a corresponding one of the transistors TR1$n$−1, TR2$n$−1, TR1$n$, TR2$n$, TR1$n$+1, TR2$n$+1, TR1$n$+2, and TR2$n$+2.

The memory cell units 300a and 300b are activated depending on word line voltages applied to the word lines WL1 and WL2. For instance, if a transistor coupled to a word line WL is turned on, a voltage between a source line SL and a bit line BL is applied to an MTJ. As mentioned above, the MTJ can store data because a magnetization direction of the MTJ changes depending on the voltage between the bit line BL and the source line SL.

The bit line BL and the source line SL are coupled to a data write/read unit 310 or 320 so as to supply a voltage or current for writing data to the bit line BL or the source line SL or supply a voltage or current corresponding to data read out through the bit line BL or the source line SL to a sense node NS.

The reference value generating cell unit 200 includes a reference value write/read unit 210 coupled to a reference bit line BLref and a reference source line SLref.

The reference value write/read unit 210 may be set so that a reference value generating cell has a given resistance value to provide a reference value. A magnetization degree of free layers included in reference MTJs 100$r$1 and 100$r$2 of the reference value generating cells may be previously set. Thus, the reference value generating cells are set to have a single reference value so as to supply a specific voltage or current value to the reference bit line BLref or the reference source line SLref through the reference value write/read unit 210 in response to an external control signal. If a single reference value is used to determine a logic value of data written in the memory cell units 300a and 300b, the reference value write/read unit 210 senses a voltage or current on the reference bit line BLref or the reference source line SLref and supplies the sensed voltage or current to a reference node NR. The voltage or current value supplied to the reference node NR is the single reference value, which is generated based on a current or voltage value of the reference value generating cell when a corresponding word line is activated.

The memory cell units 300a and 300b and the reference value generating cell unit 200 may be included in one memory cell block.

The sense circuit 400 amplifies a voltage or current difference between the sense node NS and the reference node NR and outputs the amplified signal as a sense output signal SO. The data determining unit 500 determines whether data written in a memory cell has a logic value "0" or "1" based on the sense output signal SO.

As described above, the MTJ of the memory cell has a different size from that of the reference value generating cell. Therefore, even when the same voltage is applied to the memory cell and the reference value generating cell, a resistance value of each MTJ is different due to the difference in size. As a result, the single reference value outputted from the reference value generating cell, that is, a voltage or current value of the reference node NR, may be an intermediate value to determine whether data written in the memory cell has data "0" or "1". For example, it is assumed that the MTJ of the memory cell is at a low resistance state when the data "0" is written and at a high resistance state when the data "1" is written, the reference value generating cell may be previously set to have a resistance value between the low resistance state and the high resistance state of the MTJ of the memory cell.

In some example embodiments, the data determining unit 500 may determine the read value as "1" or "0" when the sense output signal is the same as the single reference value.

In the conventional semiconductor memory device, two reference cells for providing two reference values corresponding to data "0" or "1" are coupled in parallel so as to compare their reference values with a value of a sense node. On the other hand, the semiconductor memory device according to an embodiment of the present invention includes a reference value generating cell for generating a single reference value, thereby minimizing an area required for providing the reference value.

Figure 4:
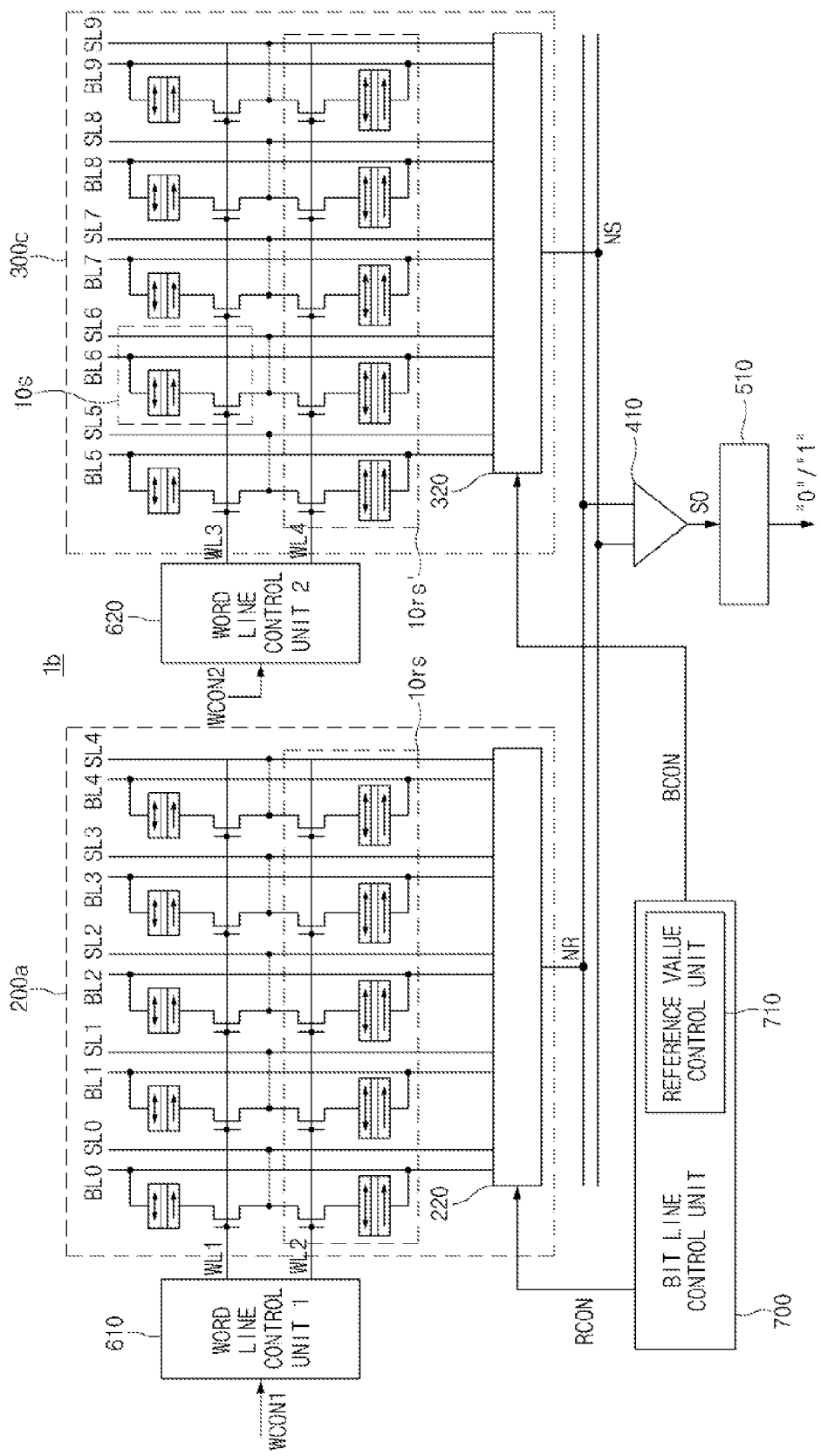
FIG. 4 illustrates a semiconductor memory device according to another embodiment of the present invention.

FIG. 4 illustrates a semiconductor memory device 1b according to another embodiment of the present invention.

Referring to FIG. 4, the semiconductor memory device 1b includes a reference value generating cell unit 200a, a memory cell unit 300c, a first word line control unit 610, a second word line control unit 620, and a bit line control unit 700.

In FIG. 4, the reference value generating cell unit 200a and the memory cell unit 300c are controlled by the different word line control units 610 and 620, respectively. However, in an embodiment, as shown in FIG. 3, the reference value generating cell unit 200 and the memory cell units 300a and 300b may be included in one memory cell block, and provide a single reference value and a read value in response to one activated word line. On the other hand, in the semiconductor memory device 1b of FIG. 4, the reference value generating cell unit 200a provides a single reference value through a reference node NR in response to a word line activated by the first word line control unit 610, and the memory cell unit 300c provides a read value through a sense node NS in response to a word line activated by the second word line control unit 620.

In accordance with another embodiment, the reference value generating cell unit 200a may not have substantially the same configuration as that of the memory cell unit 300c. However, in accordance with the embodiment shown in FIG. 4, although the memory blocks have the same configuration, the reference value generating cell unit 200a and the memory cell unit 300c may include reference value generating cells 10rs and 10rs', respectively. Reference MTJs included in the reference value generating cells 10rs or 10rs' may be set to have a given resistance value before a read operation is performed.

Even though the reference value generating cell unit 200a may have substantially the same configuration as that of the memory cell unit 300c, these elements may be referred as how they functions. For example, if it is assumed that data of the memory cells included in the memory cell unit 300c are read out based on a selected address signal in the read operation, when data written to a selected memory cell 10s of the memory cell unit 300c, which is coupled between a third word line WL3 and a seventh bit line BL6, is read out, a first word line control signal WCON1 and a second word line control signal WCON2 are generated based on the selected address signal and then supplied to the first word line control unit 610 and the second word line control unit 620, respectively.

In response to the first word line control signal WCON1, the second word line WL2 is activated, and a single reference value is supplied to the reference node NR through the reference value write/read unit 220. The single reference value supplied to the reference node NR may be generated based on an average resistance value of the reference value generating cells 10rs. In accordance with an embodiment, the single reference value may be generated based on an average resistance value of the overall reference value generating cells 10rs included in the reference value generating cell unit 200a. In accordance with another embodiment, the single reference value may be generated based on an average resistance value of a part of the reference value generating cells 10rs.

The part of the reference value generating cells 10rs may be selected by controlling a current flow or controlling a voltage difference between the bit line BL and the source line SL using a reference value control signal RCON output from a reference value control unit 710 included in a bit line control unit 700. For example, the reference value write/read unit 220 can apply the same voltage to second to fifth bit lines BL1, BL2, BL3, and BL4 and second to fifth source lines SL1, SL2, SL3, and SL4 in response to the reference value control signal RCON. In this case, the single reference value is supplied only through one reference value generating cell coupled to and disposed between the first bit line BL0 and the first source line SL0 among five reference value generating cells included in the reference value generating cells 10rs.

The selection of the reference value generating cell to generate the single reference value is performed in response to the reference value control signal RCON to prevent a mis-operation resulting from a manufacturing process variation. The semiconductor memory device according to an embodiment of the present invention includes the reference value generating cell having an intermediate value for determining a bit value of data. However, since the reference MTJ of the reference value generating cell may not have a desired size, due to the manufacturing process variation, the data written in the memory cell may not be correctly determined based on a reference value from a single reference value generating cell. In order to solve this problem, the single reference value is generated based on the average resistance value of the reference value generating cells 10rs including a plurality of reference value generating cells each having an intermediate value for determining a bit value of data.

If a size of a specific reference value generating cell is not within a desired range, the reference value control signal RCON is generated so as to allow the single reference value to be generated based on an average resistance value of other reference value generating cells than the specific reference value generating cell. In order to regulate an operating speed, the number of activated reference value generating cells may be adjusted by the reference value control signal RCON. While the accuracy of the single reference value may be improved as the number of the activated reference value generating cells becomes greater, the speed of generating the single reference value may be degraded.

When the single reference value is provided by the reference value generating cell unit 200a, the second word line control unit 620 may activate the third word line WL3 in response to the second word line control signal WCON2. The write/read unit 320 receives a read value from the seventh bit line BL6 and the seventh source line SL6, which are coupled to the selected memory cell 10s, so as to supply the read value to the sense node NS.

The sense circuit 410 receives the single reference value and the read value from the reference node NR and the sense node NS, respectively, and amplifies the difference between the single reference value and the read value to output a sense output signal SO. The data determining unit 510 determines a logic value of data written in the selected memory cell 10s in response to the sense output signal SO.

As described above, when data written in a memory cell in a specific memory cell block is read out in response to an address signal, its adjacent memory cell block may act as the reference value generating cell unit 200a. For instance, as shown in FIG. 4 and described above, if data is written in a memory cell within the memory cell unit 300c, the single reference value is generated based on an average resistance value of the reference value generating cells 10rs included in the cell unit 200a, which is used as the reference value generating cell unit. On the other hand, if data is written in a memory cell within the reference value generating cell unit 200a, the single reference value may be generated based on an average resistance value of the reference value generating cells 10rs' included in the memory cell unit 300c.

The bit line control unit 700 supplies a bit line control signal BCON and the reference value control signal RCON to the write/read unit 320 of the memory cell unit 300c and the reference value write/read unit 220 of the reference value generating cell unit 200a, respectively. Although, in FIG. 4, the reference value control unit 710 is included in the bit line control unit 700, the reference value control unit 710 may be implemented apart from the bit line control unit 700.

The reference value control unit 710 controls activation of the reference value generating cells 10rs in the reference value generating cell unit 200a to select at least one reference value generating cell for generating the single reference value, or controls magnetization phases of the reference MTJs in the reference value generating cells 10rs so that the reference value generating cells 10rs have a specific reference value before the read operation is performed.

As a result, embodiments of the present invention have the following effects.

First, in comparison with the conventional art, which needs two reference cells for generating two reference values to determine a bit value of data written in a memory cell, the semiconductor memory device according to an embodiment of the present invention provides a single reference value using a single reference value generating cell to determine the bit value of data, thereby reducing an area required for implementing the reference value generating cell.

Second, when each of reference value generating cells cannot provide a desired reference value by a manufacturing process variation, the semiconductor memory device according to the embodiments of the present invention can provide a single reference value obtained by averaging reference values of a plurality of reference value generating cells coupled in parallel, so that it is possible to minimize the effects of manufacturing process variation. Using the single reference value obtained by averaging the reference values of the plurality of reference value generating cells, the semiconductor memory device according to an embodiment of the present invention can stably operate.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A semiconductor memory device, comprising:
a memory cell unit including a plurality of memory cells coupled to and disposed between a plurality of word lines and a plurality of bit lines and configured to provide a read value in response to an activated word line;
a reference value generating unit including a plurality of reference value generating cells coupled to and disposed between the plurality of word lines and a single reference bit line, wherein the plurality of reference value generating cells is configured to provide a single reference value in response to the activated word line, the single reference value corresponding to a value to determine a logic state of the read value; and
a sense circuit configured to provide a sense output signal based on the single reference value and the read value,
wherein a reference value generating cell has a different size from that of a memory cell.

2. The semiconductor memory device according to claim 1, wherein each of the memory cells and the reference value generating cells includes one transistor and one magnetic tunnel junction (MTJ), and
wherein an MTJ included in a reference value generating cell is larger than an MTJ included in a memory cell.

3. The semiconductor memory device according to claim 1, further comprising a data determining unit configured to receive the sense output signal and determine the read value as first data if the read value is the same as or greater than the single reference value and as second data if the read value is smaller than the single reference value.

4. The semiconductor memory device according to claim 1, wherein the reference value generating cell unit comprises a write/read unit configured to control the reference value generating cells using the reference bit line so that the reference value generating cells have a predetermined resistance value.

5. A semiconductor memory device, comprising:
a reference value generating cell unit including a plurality of reference value generating cells coupled to and disposed between at least one first word line and a plurality of reference generating bit lines, wherein the plurality of reference value generating cells is configured to provide a single reference value in response to an activated first word line, each of the reference value generating cells providing a value that is substantially the same as the single reference value corresponding to a value to determine a logic state of a read value;
a memory cell unit including a plurality of memory cells coupled to and disposed between a plurality of second word lines and a plurality of bit lines and configured to provide the read value in response to an activated second word line; and
a sense circuit configured to provide a sense output signal based on the single reference value and the read value,
wherein the at least one first word line is separate from the plurality of second word lines.

6. The semiconductor memory device according to claim 5, further comprising a reference value control unit configured to generate a reference control signal for controlling a reference generating signal supplied to the plurality of reference generating bit lines or source lines coupled to the plurality of reference value generating cells so as to determine the single reference value.

7. The semiconductor memory device according to claim 5, wherein each of the memory cells includes one MTJ and one transistor that are coupled in series between a corresponding bit line and a corresponding source line, and the transistor performs a switching operation in response to activation of a corresponding second word line.

8. The semiconductor memory device according to claim 7, wherein each of the reference value generating cells includes one MTJ and one transistor that are coupled in series between a corresponding reference generating bit line and a corresponding source line, and the transistor performs a switching operation in response to activation of the first word line.

9. The semiconductor memory device according to claim 8, wherein the MTJ included in the reference value generating cell is larger than the MTJ included in the memory cell.

10. The semiconductor memory device according to claim 5, wherein the single reference value is generated based on an average resistance value of reference value generating cells coupled to the activated first word line.

11. The semiconductor memory device according to claim 10, wherein the average resistance value is obtained by a part or all of the reference value generating cells included in the reference value generating cell unit.

12. A semiconductor memory device, comprising:
 memory cell blocks each of which includes reference value generating cells coupled to and disposed between at least one first word line and a plurality of bit lines and memory cells coupled between the bit lines and a plurality of second word lines that is disposed in parallel with the first word line;
 a word line control unit configured to control each word line of the memory cell blocks; and
 a bit line control unit configured to control each bit line of the memory cell blocks,
 wherein in a read operation, the word line control unit is configured to activate a first word line of a first one of the memory cell blocks so as to output a single reference value based on an average resistance value of reference value generating cells in the first memory cell block, and to activate one of second word lines of a second one of the memory cell blocks based on an address signal so as to output a read value from a memory cell in the second memory cell block, which is selected by the address signal, each of the reference value generating cells providing a value that is substantially the same as the single reference value corresponding to a value to determine a logic state of the read value,
 wherein the at least one first word line is separate from the plurality of second word lines.

13. The semiconductor memory device according to claim 12, wherein each of the reference value generating cells and the memory cells includes one transistor and one MTJ that are coupled in series between a corresponding bit line and a corresponding source line, and an MTJ included in a reference value generating cell is larger than an MTJ included in a memory cell.

14. The semiconductor memory device according to claim 13, wherein the bit line control unit is configured to control a read current supplied to bit lines or source lines coupled to the first memory cell block so as to determine the single reference value.

15. The semiconductor memory device according to claim 12, further comprising a data determining unit configured to compare the read value with the single reference value so as to determine a logic value of data written in the selected memory cell.

16. The semiconductor memory device according to claim 12, wherein the average resistance value is obtained by a part or all of the reference value generating cells included in the first memory cell block.

17. The semiconductor memory device according to claim 12, wherein the first and second word lines of the first memory cell block are separately controlled from those of the second memory cell block.

\* \* \* \* \*